(12) United States Patent
Choi et al.

(10) Patent No.: US 10,007,028 B2
(45) Date of Patent: Jun. 26, 2018

(54) PHOTOSENSITIVE RESIN COMPOSITION AND COLOR FILTER USING THE SAME

(71) Applicant: Samsung SDI Co., Ltd., Yongin-si (KR)

(72) Inventors: Se-Young Choi, Suwon-si (KR); Jae-Young Kwon, Suwon-si (KR); Eun-Bi Park, Suwon-si (KR); Jung-Sun Lee, Suwon-si (KR); Chang-Ryul Lee, Suwon-si (KR); Ju-Ho Jung, Suwon-si (KR); Mi-Jin Choi, Suwon-si (KR); Seung-Jib Choi, Suwon-si (KR); Kyung-Hee Hyung, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 642 days.

(21) Appl. No.: 14/593,243

(22) Filed: Jan. 9, 2015

(65) Prior Publication Data
US 2015/0331316 A1 Nov. 19, 2015

(30) Foreign Application Priority Data
May 13, 2014 (KR) .................. 10-2014-0057323

(51) Int. Cl.
| | |
|---|---|
| *G02B 5/23* | (2006.01) |
| *G02B 1/04* | (2006.01) |
| *G03F 7/033* | (2006.01) |
| *C09B 67/48* | (2006.01) |
| *G03F 7/00* | (2006.01) |
| *G02B 5/22* | (2006.01) |
| *C09B 47/067* | (2006.01) |
| *C09B 67/46* | (2006.01) |
| *G03F 7/038* | (2006.01) |
| *G03F 7/105* | (2006.01) |

(52) U.S. Cl.
CPC ............ *G02B 1/04* (2013.01); *C09B 47/0671* (2013.01); *C09B 47/0675* (2013.01); *C09B 67/003* (2013.01); *C09B 67/009* (2013.01); *C09B 67/0089* (2013.01); *G02B 5/223* (2013.01); *G02B 5/23* (2013.01); *G03F 7/0007* (2013.01); *G03F 7/033* (2013.01); *G03F 7/038* (2013.01); *G03F 7/105* (2013.01)

(58) Field of Classification Search
USPC .................. 430/7, 270.1, 280.1; 252/586
See application file for complete search history.

(56) References Cited

U.S. PATENT DOCUMENTS

| | | | |
|---|---|---|---|
| 5,380,842 A | * | 1/1995 | Itoh .................... C07D 209/44 540/128 |
| 5,998,091 A | | 12/1999 | Suzuki |
| 6,033,813 A | | 3/2000 | Endo et al. |
| 6,733,935 B2 | | 5/2004 | Kishimoto et al. |
| 7,517,619 B2 | | 4/2009 | Hosaka et al. |
| 2008/0160432 A1 | | 7/2008 | Byon et al. |
| 2010/0104985 A1 | | 4/2010 | Watanabe |

FOREIGN PATENT DOCUMENTS

| | | |
|---|---|---|
| JP | 06-041458 A | 2/1994 |
| JP | 07-140654 A | 6/1995 |
| JP | 10-254133 A | 9/1998 |
| JP | 2011100144 | * 5/2011 |
| KR | 10-2002-0015650 A | 2/2002 |
| KR | 10-2005-0020653 A | 3/2005 |
| KR | 10-1999-0007097 A | 8/2005 |
| KR | 10-2008-0061191 A | 10/2008 |

(Continued)

OTHER PUBLICATIONS

Search Report in counterpart Taiwanese Application No. 104105204 dated Sep. 18, 2015, pp. 1.

(Continued)

*Primary Examiner* — Monique Peets
(74) *Attorney, Agent, or Firm* — Additon, Higgins & Pendleton, P.A.

(57) ABSTRACT

A photosensitive resin composition includes (A) a binder resin including an epoxy resin; (B) a photopolymerizable monomer; (C) a photopolymerization initiator; (D) a colorant including a dye represented by the following Chemical Formula 1, wherein in the above Chemical Formula 1, each substituent is the same as defined in the detailed description; and (E) a solvent.

[Chemical Formula 1]

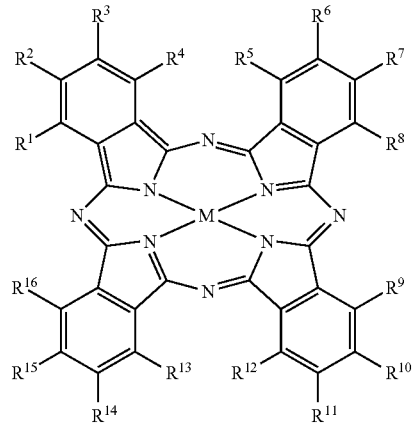

16 Claims, 2 Drawing Sheets

(56) References Cited

FOREIGN PATENT DOCUMENTS

| | | |
|---|---|---|
| KR | 10-2009-0106226 A | 10/2009 |
| KR | 10-2009-0128379 A | 12/2009 |
| KR | 10-2010-0078845 A | 7/2010 |
| KR | 10-2010-0080142 A | 7/2010 |
| TW | 201319741 A | 5/2013 |
| TW | 201321802 A | 6/2013 |
| TW | 201337457 A | 9/2013 |

OTHER PUBLICATIONS

Search Report in commonly owned Taiwanese Application No. 103142078 dated Nov. 5, 2015, pp. 1.
Kurt et al., "Synthesis and photophysical properties of novel hexadeca-substituted phthalocyanines bearing three different groups", Journal of Organometallic Chemistry, vol. 754, 2014, pp. 8-15.
Al-Raqa et al., "Preparation and optical properties of novel symmetrical hexadecachlorinatedphthalocyaninato zinc(II) spin coated thin films," Polyhedron 27 (2008) 1256-1261, Feb. 2008.
Atsay et al., "A new hexadeca substituted non-aggregating zinc phthalocyanine," Dyes and pigments 100 (2014) 177-183, Sep. 2013.
U.S. Appl. No. 14/528,125, filed Oct. 30, 2014, pp. 1-53.

* cited by examiner

PHOTOSENSITIVE RESIN COMPOSITION AND COLOR FILTER USING THE SAME

CROSS-REFERENCE TO RELATED APPLICATION

This application claims priority to and the benefit of Korean Patent Application No. 10-2014-0057323 filed in the Korean Intellectual Property Office on May 13, 2014, the entire disclosure of which is incorporated herein by reference.

FIELD OF THE INVENTION

This disclosure relates to a photosensitive resin composition and a color filter using the same.

BACKGROUND

Color filters are used for liquid crystal displays (LCD), optical filters for cameras, and the like. Color filters may be manufactured by coating a fine region colored with three or more colors on a charge coupled device or a transparent substrate. This colored thin film can be manufactured using various methods, such as a pigment dispersion method, and the like.

A color photosensitive resin composition used for manufacturing a color filter by the pigment dispersion method generally includes a binder resin, a photopolymerizable monomer, a photopolymerization initiator, a pigment, a solvent, other additives, and the like.

Because the pigment used in the pigment dispersion method has a limit in securing excellent luminance, an effort to improve luminance characteristics has been made by improving the binder resin. For example, Japanese Patent Laid-Open Pyeung 7-140654 and Pyeung 10-254133 use a carboxyl group-containing acrylic-based copolymer as the binder resin.

However, a color filter having much improved luminance, heat resistance, and the like has been recently required due to high quality specifications, but current improvements of the pigment or the binder resin do not satisfy these requirements. Accordingly, there is a need for a photosensitive resin composition that can provide improved color characteristics such as luminance and the like and heat resistance by adding other components rather than improving the pigment and the binder resin.

SUMMARY

One embodiment provides a photosensitive resin composition that can have excellent color characteristics, heat resistance and chemical resistance.

Another embodiment provides a color filter manufactured using the photosensitive resin composition.

One embodiment provides a photosensitive resin composition including (A) a binder resin including an epoxy resin; (B) a photopolymerizable monomer; (C) a photopolymerization initiator; (D) a colorant including a dye represented by the following Chemical Formula 1; and (E) a solvent.

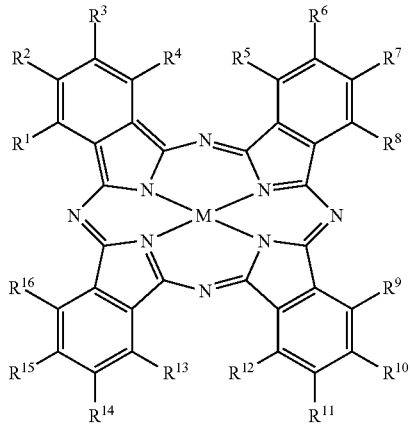

[Chemical Formula 1]

In the Chemical Formula 1,

M is Cu, Zn, Co, or Mo, $R^1$ to $R^{16}$ are the same or different and are each independently hydrogen, halogen, substituted or unsubstituted C1 to C20 alkyl, substituted or unsubstituted C1 to C20 alkoxy, substituted or unsubstituted C6 to C20 aryl, or substituted or unsubstituted C6 to C20 aryloxy, wherein at least one of $R^1$ to $R^{16}$ is substituted or unsubstituted C1 to C20 alkoxy, and at least one of $R^1$ to $R^{16}$ is substituted or unsubstituted C6 to C20 aryloxy.

Examples of the C1 to C20 alkoxy may include without limitation methoxy, ethoxy, propoxy, butoxy, pentyloxy, hexyloxy, heptyloxy, octyloxy, nonyloxy, and/or decyloxy.

The C6 to C20 aryloxy may be represented by the following Chemical Formula 2.

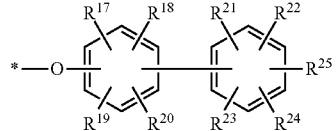

[Chemical Formula 2]

In Chemical Formula 2, $R^{17}$ to $R^{25}$ are the same or different and are each independently hydrogen, halogen, or substituted or unsubstituted C1 to C8 alkyl.

In exemplary embodiments, at least one of $R^1$ to $R^4$ may be substituted or unsubstituted C6 to C20 aryloxy, at least one of $R^5$ to $R^8$ may be substituted or unsubstituted C6 to C20 aryloxy, at least one of $R^9$ to $R^{12}$ may be substituted or unsubstituted C6 to C20 aryloxy, and at least one of $R^{13}$ to $R^{16}$ may be substituted or unsubstituted C1 to C20 alkoxy.

In exemplary embodiments, at least one of $R^1$ to $R^4$ may be substituted or unsubstituted C6 to C20 aryloxy, at least one of $R^5$ to $R^8$ may be substituted or unsubstituted C1 to C20 alkoxy, at least one of $R^9$ to $R^{12}$ may be substituted or unsubstituted C1 to C20 alkoxy, and at least one of $R^{13}$ to $R^{16}$ may be substituted or unsubstituted C1 to C20 alkoxy.

In exemplary embodiments, at least one of $R^1$ to $R^4$ may be substituted or unsubstituted C6 to C20 aryloxy, at least one of $R^5$ to $R^8$ may be substituted or unsubstituted C1 to C20 alkoxy, at least one of $R^9$ to $R^{12}$ may be substituted or unsubstituted C6 to C20 aryloxy, and at least one of $R^{13}$ to $R^{16}$ may be substituted or unsubstituted C1 to C20 alkoxy.

In exemplary embodiments, at least one of $R^1$ to $R^4$ may be substituted or unsubstituted C6 to C20 aryloxy, at least one of $R^5$ to $R^8$ may be substituted or unsubstituted C6 to C20 aryloxy, at least one of $R^9$ to $R^{12}$ may be substituted or unsubstituted C1 to C20 alkoxy, and at least one of $R^{13}$ to $R^{16}$ may be substituted or unsubstituted C1 to C20 alkoxy.

The dye represented by Chemical Formula 1 may be represented by one of the following Chemical Formulae 3 to 6. In addition, the dye represented by Chemical Formula 1 may be a mixture of at least two of compounds represented by the following Chemical Formulae 3 to 6.

[Chemical Formula 3]

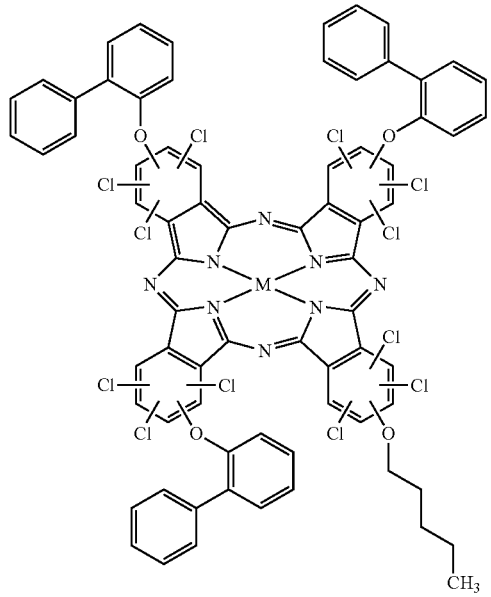

[Chemical Formula 4]

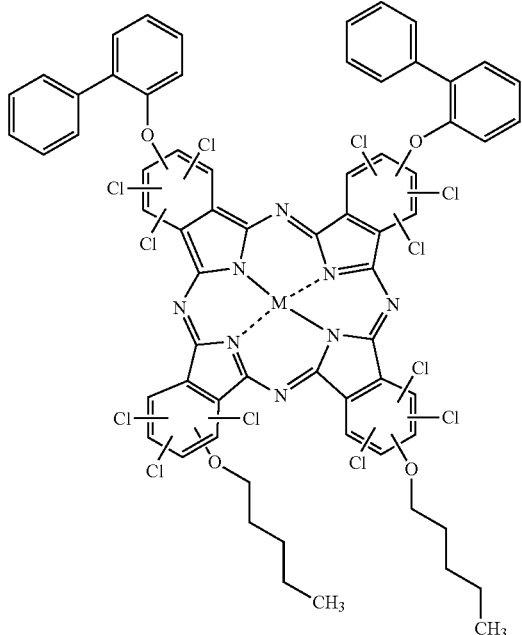

[Chemical Formula 5]

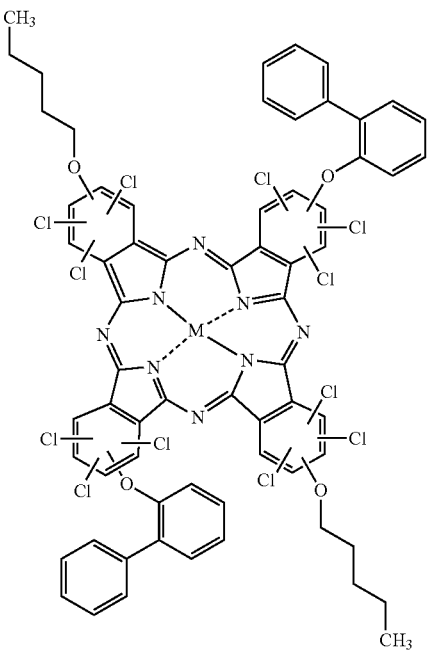

[Chemical Formula 6]

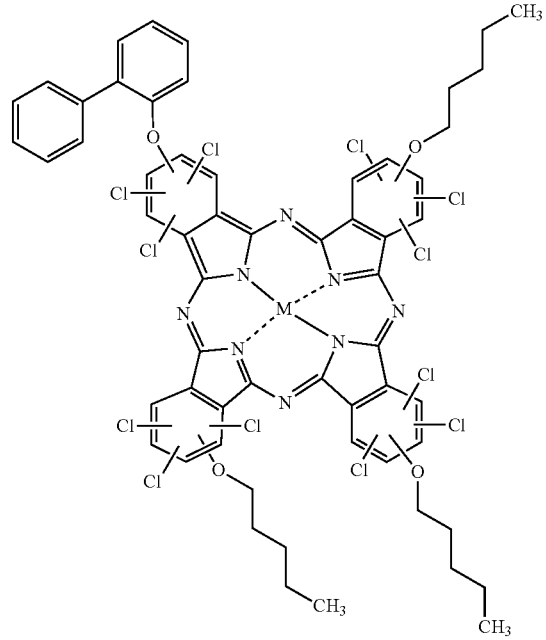

In Chemical Formulae 3 to 6,
M is Cu, Zn, Co or Mo.

The photosensitive resin composition may include the dye represented by Chemical Formula 1 in an amount of about 2 wt % to about 3 wt % based on the total amount (total weight, 100 wt %) of the photosensitive resin composition.

The dye represented by the Chemical Formula 1 may be a green dye.

The colorant may further include a pigment.

The dye and the pigment may be included in a weight ratio of about 3:7 to about 7:3.

The binder resin may further include an acrylic-based binder resin.

The photosensitive resin composition may include (A) about 1 wt % to about 30 wt % of the binder resin; (B) about 1 wt % to about 20 wt % of the photopolymerizable monomer; (C) about 0.1 wt % to about 10 wt % of the photopolymerization initiator; (D) about 40 wt % to about 70 wt % of the colorant; and (E) a balance amount of the solvent.

The photosensitive resin composition may further include at least one additive selected from malonic acid; 3-amino-1,2-propanediol; a silane-based coupling agent having a vinyl group or a (meth)acryloxy group; a leveling agent; a fluorine-based surfactant; and a radical polymerization initiator.

Another embodiment provides a color filter using the photosensitive resin composition. Other embodiments of the present invention are included in the following detailed description.

The photosensitive resin composition may be used for a color filter due to improved color characteristics, heat resistance and chemical resistance.

DETAILED DESCRIPTION

Figure 1:
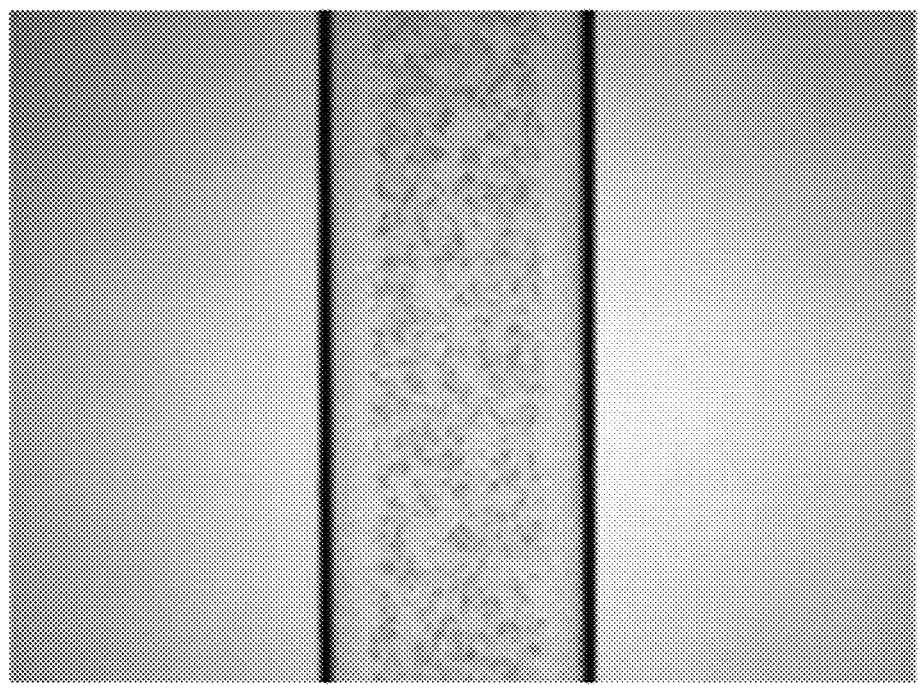
FIG. 1 is a photograph showing a pattern according to Comparative Example 1.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to substitution with halogen (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, C1 to C20 alkyla C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof, instead of at least one hydrogen.

As used herein, when a specific definition is not otherwise provided, the term "hetero" may refer to one substituted with at least one hetero atom of N, O, S and/or P, instead of at least one C in a cyclic substituent.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to mixing or copolymerization.

As used herein, unless a specific definition is otherwise provided, a hydrogen atom is bonded at a position when a chemical bond is not drawn where a bond would otherwise appear.

As used herein, when a specific definition is not otherwise provided, the term "epoxy equivalent" refers to a gram of a resin including 1 equivalent epoxy group.

As used herein, when a specific definition is not otherwise provided, "*" indicates a point where the same or different atom or chemical formula is linked.

A photosensitive resin composition according to one embodiment includes (A) a binder resin including an epoxy resin, (B) a photopolymerizable monomer, (C) a photopolymerization initiator, (D) a colorant, and (E) a solvent.

The colorant (D) includes a dye represented by the following Chemical Formula 1. The photosensitive resin composition including the dye may improve luminance, and furthermore may enhance heat resistance and chemical resistance and thus realize excellent processing characteristics.

[Chemical Formula 1]

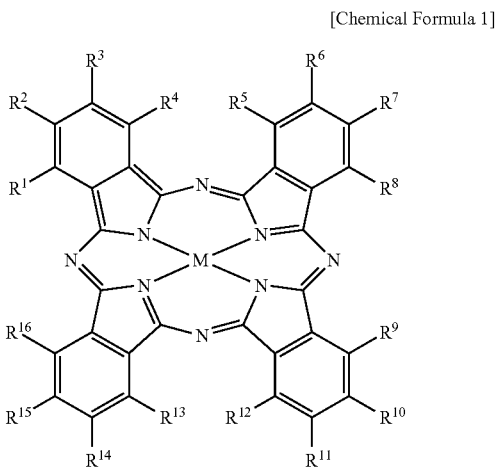

In the above Chemical Formula 1,

M is Cu, Zn, Co, or Mo, $R^1$ to $R^{16}$ are the same or different and are each independently hydrogen, a halogen, substituted or unsubstituted C1 to C20 alkyl, substituted or unsubstituted C1 to C20 alkoxy, substituted or unsubstituted C6 to C20 aryl, or substituted or unsubstituted C6 to C20 aryloxy, wherein at least one of $R^1$ to $R^{16}$ is substituted or unsubstituted C1 to C20 alkoxy, and at least one of $R^1$ to $R^{16}$ is substituted or unsubstituted C6 to C20 aryloxy.

Hereinafter, each component is described in detail.

(D) Colorant

The colorant includes a dye represented by the above Chemical Formula 1. In exemplary embodiments, in the above Chemical Formula 1, M may be Zn.

When the dye is in a solution state, the dye has no particle or a very small particle having a primary particle diameter of about 1 nm to about 10 nm, in contrast to a pigment having a particle. Thus, the dye may have excellent dissolubility for a solvent and high durability. In this way, when the dye has a smaller particle diameter than that of a pigment, light scattering can be decreased. As a result, contrast ratio and luminance may be improved. Accordingly, the contrast ratio and luminance deterioration problem associated with a pigment dispersion method typically used to manufacture a color filter may be compensated.

The dye having the above characteristics may realize high luminance and a high contrast ratio in a desired color coordinate and may be usefully used for a LCD (Liquid Crystal Display) color filter using a cold cathode fluorescent lamp (CCFL) or a light emitting diode (LED) as a backlight.

In the above Chemical Formula 1, $R^1$ to $R^{16}$ may be the same or different and are each independently halogen, substituted or unsubstituted C1 to C20 alkoxy or substituted or unsubstituted C6 to C20 aryloxy.

In the above Chemical Formula 1, examples of the C1 to C20 alkoxy may include without limitation methoxy, ethoxy, propoxy, butoxy, pentyloxy, hexyloxy, heptyloxy, octyloxy, nonyloxy, decyloxy, and the like and combinations thereof. For example, the C1 to C20 alkoxy may be pentyloxy.

The C6 to C20 aryloxy may be represented by the following Chemical Formula 2.

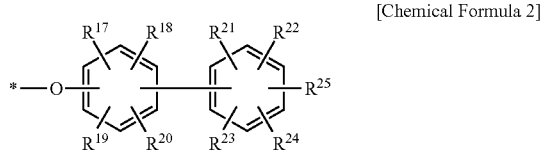

[Chemical Formula 2]

In Chemical Formula 2, $R^{17}$ to $R^{25}$ are the same or different and are each independently hydrogen, halogen, or substituted or unsubstituted C1 to C8 alkyl.

For example, at least one of $R^1$ to $R^4$ may be substituted or unsubstituted C6 to C20 aryloxy, at least one of $R^5$ to $R^8$ may be substituted or unsubstituted C6 to C20 aryloxy, at least one of $R^9$ to $R^{12}$ may be substituted or unsubstituted C6 to C20 aryloxy, and at least one of $R^{13}$ to $R^{16}$ may be substituted or unsubstituted C1 to C20 alkoxy.

For example, at least one of $R^1$ to $R^4$ may be substituted or unsubstituted C6 to C20 aryloxy, at least one of $R^5$ to $R^8$ may a substituted or unsubstituted C1 to C20 alkoxy, at least one of $R^9$ to $R^{12}$ may be substituted or unsubstituted C1 to C20 alkoxy, and at least one of $R^{13}$ to $R^{16}$ may be substituted or unsubstituted C1 to C20 alkoxy.

For example, at least one of $R^1$ to $R^4$ may be substituted or unsubstituted C6 to C20 aryloxy, at least one of $R^5$ to $R^8$ may be substituted or unsubstituted C1 to C20 alkoxy, at least one of $R^9$ to $R^{12}$ may be substituted or unsubstituted C6 to C20 aryloxy, and at least one of $R^{13}$ to $R^{16}$ may be substituted or unsubstituted C1 to C20 alkoxy.

For example, at least one of $R^1$ to $R^4$ may be substituted or unsubstituted C6 to C20 aryloxy, at least one of $R^5$ to $R^8$ may be substituted or unsubstituted C6 to C20 aryloxy, at least one of $R^9$ to $R^{12}$ may be substituted or unsubstituted C1 to C20 alkoxy, and at least one of $R^{13}$ to $R^{16}$ may be substituted or unsubstituted C1 to C20 alkoxy.

The dye represented by the Chemical Formula 1 includes an alkoxy group and an aryloxy group and thus can improve curing properties of a pattern when a composition including the dye represented by Chemical Formula 1 is cured as well as can have excellent solubility.

The dye represented by the Chemical Formula 1 has excellent green spectral characteristics and a high molar extinction coefficient and realizes clear green and thus, may be used as a green dye. In general, a G58 pigment dispersion used to manufacture a green color filter is prepared by using a dispersing agent including amine value and thus has no compatibility with a binder resin including an epoxy resin due to the dispersing agent including amine value. However, the dye represented by the Chemical Formula 1 instead of the G58 pigment dispersion has compatibility with the binder resin including an epoxy resin and thus can improve color characteristics and durability of a photosensitive resin composition.

The dye represented by Chemical Formula 1 may be used by being dissolved in a solvent such as PGMEA and the like. For example, the photosensitive resin composition may include a solution obtained by dissolving the dye represented by Chemical Formula 1 in an amount of about 40 wt % to about 60 wt %, for example, about 40 wt % to about 50 wt %, based on the total amount (100 wt %) of the photosensitive resin composition. In some embodiments, the photosensitive resin composition may include the solution obtained by dissolving the dye represented by Chemical Formula 1 in an amount of about 40, 41, 42, 43, 44, 45, 46, 47, 48, 49, 50, 51, 52, 53, 54, 55, 56, 57, 58, 59, or 60 wt %. Further, according to some embodiments of the present invention, the amount of the solution obtained by dissolving the dye represented by Chemical Formula 1 can be in a range from about any of the foregoing amounts to about any other of the foregoing amounts.

Stated differently, the photosensitive resin composition may include the dye represented by Chemical Formula 1 in an amount of about 2 wt % to about 3 wt %, for example, about 2 wt % to about 2.5 wt %, based on the total amount (total weight, 100 wt %) of the photosensitive resin composition. In some embodiments, the photosensitive resin composition may include the dye represented by Chemical Formula 1 in an amount of about 2, 2.5, or 3 wt %. Further, according to some embodiments of the present invention, the amount of the dye represented by Chemical Formula 1 can be in a range from about any of the foregoing amounts to about any other of the foregoing amounts.

When a solution obtained by dissolving the dye represented by Chemical Formula 1 is included in an amount of less than about 40 wt % based on 100 wt % of the photosensitive resin composition, color characteristics may be remarkably deteriorated, while when the solution is included in an amount of greater than about 60 wt %, there may be a problem of precipitating the dye after baking or deteriorating heat resistance and the like.

The dye represented by the Chemical Formula 1 may be, for example at least one or more of compounds represented by the following Chemical Formulae 3 to 6. That is to say, the dye represented by the Chemical Formula 1 may be represented by one of the following Chemical Formulae 3 to 6, and the dye represented by the Chemical Formula 1 may be a mixture of at least two of compounds represented by the following Chemical Formulae 3 to 6.

[Chemical Formula 3]

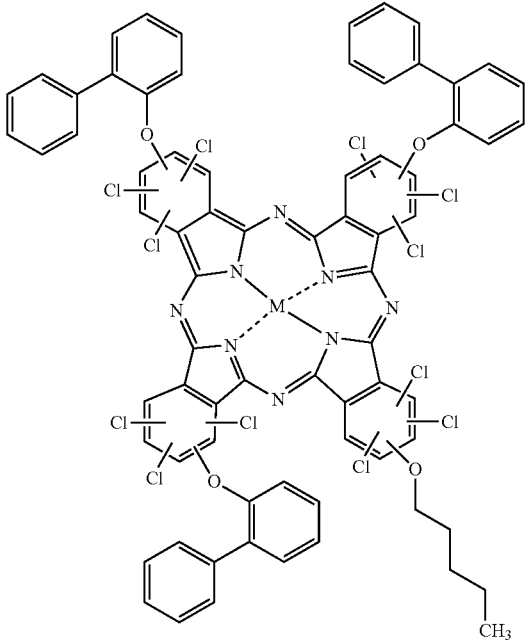

[Chemical Formula 4]

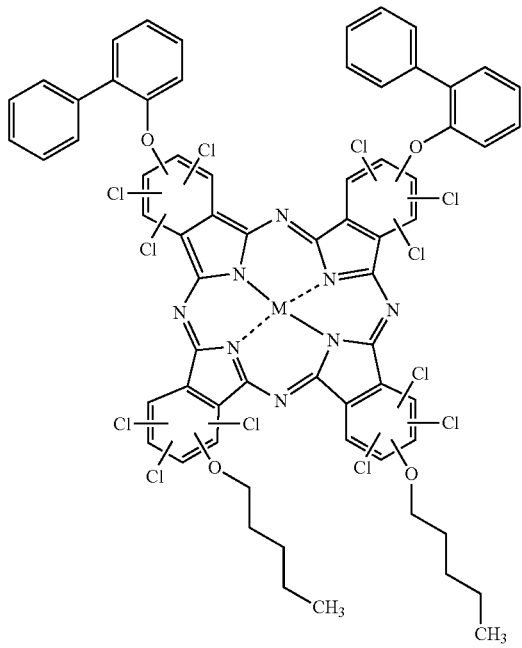

[Chemical Formula 5]

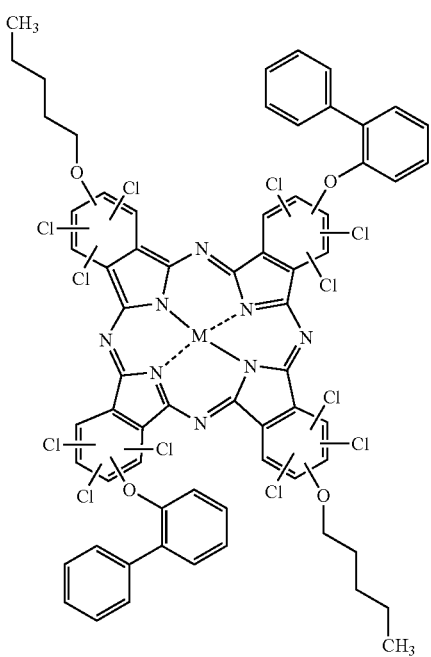

[Chemical Formula 6]

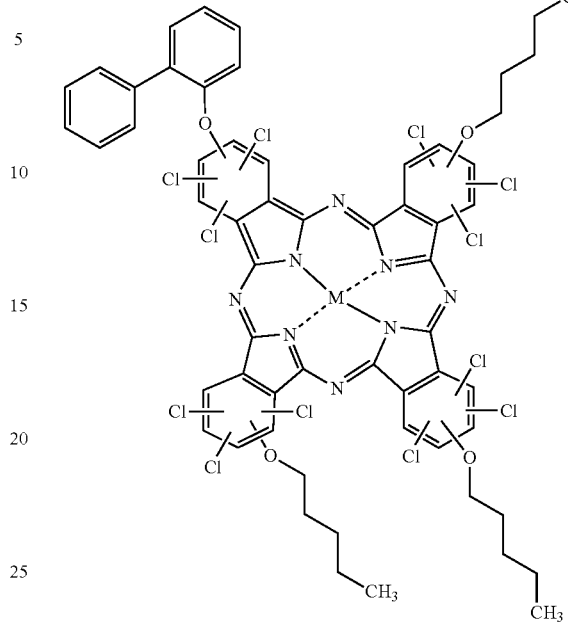

In the Chemical Formulae 3 to 6, M is Cu, Zn, Co or Mo. For example, M can be Zn The colorant may further include a pigment. The dye has inherent spectrum characteristics in a particular wavelength region and synergism with a pigment expressing a particular color. Thus, light transmittance and transmittance width of a color filter formed of the photosensitive resin composition may be adjusted, and color characteristics such as luminance, contrast ratio, and the like, and chemical resistance as well as color purity may be improved.

Examples of the pigment may include without limitation red pigments, yellow pigments, blue pigments, green pigments, and the like, and combinations thereof. For example, the pigment may be a yellow pigment.

The red pigment may be a compound having at least one azo group. Examples of the red pigment may include without limitation C.I. pigment red 254, C.I. pigment red 242, C.I. pigment red 214, C.I. pigment red 221, C.I. pigment red 166, C.I. pigment red 220, C.I. pigment red 248, C.I. pigment red 262, and the like in a color index, and may be used singularly or as a mixture of two or more.

Examples of the yellow pigment may include without limitation C.I. pigment yellow 139, C.I. pigment yellow 138, C.I. pigment yellow 150, and the like in a color index, and may be used singularly or as a mixture of two or more. For example, the yellow pigment may be the C.I. pigment yellow 138. The C.I. pigment yellow 138 has good compatibility with the epoxy resin.

The blue pigment may be a copper phthalocyanine-based blue pigment. Examples of the blue pigment may include without limitation a C.I. blue pigment (Color Index Pigment Blue) 15, 15:3, 15:4, 15:6, 60, and the like as a compound classified as a pigment in a color index and may be used singularly or as a mixture of two or more.

The green pigment may be a halogenated phthalocyanine-based green pigment. Examples of the green pigment may include without limitation a C.I. green pigment (Color Index Pigment Green) 7, 36, 58, and the like as a compound classified as a pigment in the color index and may be used singularly or as a mixture of two or more.

The pigment may be itself injected into the photosensitive resin composition according to one embodiment or injected thereinto as a pigment dispersion including one or more of a dispersing agent, a solvent, and the like.

As used herein, the dispersing agent included in the pigment dispersion may be optionally a non-ionic dispersing agent, an ionic dispersing agent, a cationic dispersing agent, or a mixture thereof. Examples of the dispersing agent may include without limitation polyalkylene glycols and esters thereof; polyoxyalkylenes; polyhydric alcohol ester alkyleneoxide addition products; alcohol alkyleneoxide addition products; alkylamines; and the like, and may be used singularly or in a combination thereof. The dispersing agent may be included in an amount of about 10 parts by weight to about 20 parts by weight based on about 100 parts by weight of the pigment.

Examples of a solvent included in the pigment dispersion composition may include without limitation ethylene glycol lacetate, ethylcellosolve, propylene glycol methylether acetate, ethyl lactate, polyethylene glycol, cyclohexanone, propylene glycolmethylether, and the like, and combinations thereof. Herein, the amount of the solvent may be adjusted, so that a solid content of the pigment dispersion may be in a range of about 5 wt % to about 30 wt %, based on the total weight (100 wt %) of the pigment dispersion.

The pigment may have a particle diameter determined by considering dispersion stability, a pixel resolution, and the like, for example, an average particle diameter ranging from about 30 nm to about 200 nm.

The photosensitive resin composition may include the pigment dispersion in an amount of about 10 wt % to about 30 wt %, based on 100 wt % of the photosensitive resin composition. In some embodiments, the photosensitive resin composition may include the pigment dispersion in an amount of about 10, 11, 12, 13, 14, 15, 16, 17, 18, 19, 20, 21, 22, 23, 24, 25, 26, 27, 28, 29, or 30 wt %. Further, according to some embodiments of the present invention, the amount of the pigment dispersion can be in a range from about any of the foregoing amounts to about any other of the foregoing amounts.

The photosensitive resin composition may include the pigment (solid content) in an amount of about 1.2 wt % to about 3.6 wt %, based on 100 wt % of the photosensitive resin composition. In some embodiments, the photosensitive resin composition may include the pigment (solid content) in an amount of about 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, or 3.6 wt %. Further, according to some embodiments of the present invention, the amount of the pigment (solid content) can be in a range from about any of the foregoing amounts to about any other of the foregoing amounts.

When the pigment dispersion is used within in an amount within the above range, color reproducibility, pattern-forming properties, close contacting properties, curing characteristics, and the like may be improved.

The dye represented by the Chemical Formula 1 and the pigment may be mixed in a weight ratio of about 3:7 to about 7:3. For example, the solution obtained by dissolving the dye represented by Chemical Formula 1 and the pigment dispersion may be mixed in a weight ratio of about 5:5 to about 9.9:0.1, for example, about 5.5:4.5 to about 9:1. Within the above weight ratio range, a high contrast ratio may not only be obtained but color characteristics also are maintained.

The photosensitive resin composition may include the colorant in an amount of about 40 wt % to about 70 wt % based on 100 wt % of the photosensitive resin composition. In some embodiments, the photosensitive resin composition may include the colorant in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the colorant can be in a range from about any of the foregoing amounts to about any other of the foregoing amounts.

When the colorant includes both the dye and the pigment (solid content), the photosensitive resin composition may include both the dye and pigment (solid content) in an amount of about 3.2 wt % to about 6.6 wt % based on 100 wt % of the photosensitive resin composition. In some embodiments, the photosensitive resin composition may include both the dye and the pigment (solid content) in an amount of about 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5 or 6.6 wt %. Further, according to some embodiments of the present invention, the amount of both of the dye and the pigment (solid content) can be in a range from about any of the foregoing amounts to about any other of the foregoing amounts.

When the colorant is used in an amount within the above range, excellent processibility and color characteristics may be obtained.

(A) Binder Resin

The binder resin includes an epoxy resin and thus may improve heat resistance. Examples of the epoxy resin may include without limitation phenol novolac epoxy resins, tetramethyl biphenyl epoxy resins, bisphenol A epoxy resins, bisphenol F epoxy resins, alicyclic epoxy resins, and the like, and combinations thereof.

Furthermore, the binder resin including an epoxy resin can secure dispersion stability of the above dye, pigment and the like and can help formation of pixels with a desire resolution during the development. Even when the above dye and/or pigment are used as a colorant, a binder resin including no epoxy resin does not have satisfactory compatibility with the above colorant, and thus, the binder resin should necessarily include the epoxy resin.

The epoxy resin may have an epoxy equivalent weight ranging from about 150 g/eq to about 200 g/eq. When the epoxy resin having an epoxy equivalent weight within the above range is included in the binder resin, the binder may improve a curing degree of a pattern and promote adhesion of the dye in a structure that the pattern is formed.

In addition, the binder resin may further include an acrylic-based binder resin. In general, when a photosensitive resin composition includes a dye, the dye may be protruded, but when the binder resin includes the acrylic-based binder resin along with the epoxy resin, the protrusion may be controlled. Accordingly, heat resistance and transmittance are maximized, and thus color characteristics such as high luminance and a high contrast ratio and the like and chemical resistance may be improved.

The acrylic-based binder resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based resin may include the first ethylenic unsaturated monomer in an amount of about 5 wt % to about 50 wt %, for example about 10 wt % to about 40 wt %, based on the total amount (total weight, 100 wt %) of the acrylic-based binder resin.

Examples of the second ethylenic unsaturated monomer may include without limitation aromatic vinyl compounds such as styrene, α-methylstyrene, vinyl toluene, vinylbenzylmethylether, and the like; unsaturated carboxylate ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile and the like; unsaturated amide compounds such as (meth)acrylamide, and the like; and the like. These may be used singularly or as a mixture of two or more.

Examples of the acrylic-based binder resin may include without limitation a (meth)acrylic acid/benzylmethacrylate copolymer, a (meth)acrylic acid/benzylmethacrylate/styrene copolymer, a (meth)acrylic acid/benzylmethacrylate/2-hydroxyethyl methacrylate copolymer, a (meth)acrylic acid/benzylmethacrylate/styrene/2-hydroxyethyl methacrylate copolymer, and the like. These may be used singularly or as a mixture of two or more.

The binder resin(s) may have a weight average molecular weight of about 6,000 g/mol to about 50,000 g/mol, for example about 6,000 g/mol to about 16,000 g/mol. When the binder resin has a weight average molecular weight within the above range, the photosensitive resin composition may have excellent physical and chemical properties and an appropriate viscosity, maintain appropriate developability and sensitivity, and show excellent close-contacting properties to a substrate during manufacture of a color filter.

The photosensitive resin composition may include the binder resin in an amount of about 1 wt % to about 30 wt %, for example about 1 wt % to about 20 wt %, based on the total amount (total weight, 100 wt %) of the photosensitive resin composition. In some embodiments, the photosensitive resin composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, developability may be improved and excellent surface smoothness may be improved due to improved cross-linking during the manufacture of a color filter.

(B) Photopolymerizable Monomer

The photopolymerizable monomer may be a mono-functional and/or multi-functional ester of (meth)acrylic acid including at least one ethylenic unsaturated double bond.

The photopolymerizable monomer has the ethylenic unsaturated double bond and thus may cause sufficient polymerization during exposure in a pattern-forming process and form a pattern having excellent heat resistance, light resistance, and chemical resistance.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolacepoxy (meth)acrylate, and the like, and combinations thereof.

Commercially available examples of the photopolymerizable monomer are as follows. Examples of a monofunctional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210®, M-240® and/or M-6200® (Toagosei Chemistry Industry Co., Ltd.), KAYARAD HDDA®, HX-220® and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030® and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The photopolymerizable monomer may be treated with acid anhydride to improve developability.

The photosensitive resin composition may include the photopolymerizable monomer in an amount of about 1 wt % to about 20 wt %, for example about 1 wt % to about 10 wt %, based on the total amount (total weight, 100 wt %) of the photosensitive resin composition. In some embodiments, the photosensitive resin composition may include the photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the When the photopolymerizable monomer is included in an amount within the above range, the photopolymerizable monomer can be sufficiently cured during exposure in a pattern-forming process and can have excellent reliability, and developability for alkali developing solution may be improved.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl benzoate methyl ester, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-chlorothioxanthone, 2-methylthioxanthone, isopropyl thioxanthone, 2,4-diethyl thioxanthone, 2,4-diisopropyl thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2,4-bis(trichloromethyl)-6-piperonyl-s-triazine, 2,4-bis(trichloromethyl)-6-(4-methoxystyryl)-s-triazine, and the like, and combinations thereof.

Examples of the oxime-based compound may include without limitation O-acyloxime-based compounds, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)-butan-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-one oxime-O-acetate, and the like, and combinations thereof.

The photopolymerization initiator may further include one or more of a carbazole-based compound, a diketone-based compound, a sulfonium borate-based compound, a diazo-based compound, an imidazole-based compound, a biimidazole-based compound, and the like, instead of or in addition to one of the above compounds.

The photosensitive resin composition may include the photopolymerization initiator in an amount of about 0.1 wt % to about 10 wt %, for example about 0.1 wt % to about 5 wt %, based on the total amount (total weight, 100 wt %) of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization can occur during exposure in a pattern-forming process, and transmittance may be prevented from deterioration due to a non-reaction initiator.

(E) Solvent

The solvent is a material having compatibility with the colorant, the binder resin, the photopolymerizable monomer, the photopolymerization initiator, and the colorant but not reacting therewith.

The solvent is not particularly limited. Examples of the solvent may include without limitation alcohols such as methanol, ethanol and the like; ethers such as dichloroethyl ether, n-butyl ether, diisoamyl ether, methylphenyl ether, tetrahydrofuran, and the like; glycol ethers such ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; alkyl lactate esters such as methyl lactate, ethyl lactate, and the like; hydroxyacetic acid alkyl esters such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like, and combinations thereof. Additionally, a solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used. They may be used singularly or as a mixture of two or more.

Considering miscibility and reactivity, glycol ethers such as ethylene glycol monoethyl ether, and the like; ethylene glycol alkylether acetates such as ethyl cellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate and the like may be used.

The photosensitive resin composition may include the solvent in a balance amount, for example about 10 wt % to 50 wt %, based on the total amount (total weight, 100 wt %) of the photosensitive resin composition. In some embodiments, the photosensitive resin composition may include the solvent in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the solvent can be in a range from about any of the foregoing amounts to about any other of the foregoing amounts.

When the solvent is included in an amount within the above range, the photosensitive resin composition can have improved processibility due to an appropriate viscosity during manufacture of a color filter.

(F) Other Additive(s)

The photosensitive resin composition may further include one or more other additives. Examples of the additives may include without limitation malonic acid; 3-amino-1,2-propanediol; a coupling agent including a vinyl group or a (meth)acryloxy group; a leveling agent; a surfactant; a radical polymerization initiator, and the like and combinations thereof. The additive(s) may prevent stains and/or spots during the coating, help adjust leveling, and/or prevent pattern residue due to non-development.

The amount of the additive(s) may be controlled depending on the desired properties of the photosensitive resin composition.

The coupling agent may be a silane-based coupling agent. Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or in a mixture of two or more.

The silane-based coupling agent may be used in an amount of about 0.01 part by weight to about 1 part by weight based on about 100 parts by weight of the photosensitive resin composition for a color filter.

The photosensitive resin composition for a color filter may further include a surfactant as needed.

Examples of the surfactant may include without limitation F-482, F-484, and/or F-478, available from DIC Co., Ltd., and the like, and combinations thereof.

The surfactant may be included in an amount of about 0.01 wt % to about 5 wt %, for example, about 0.1 wt % to about 2 wt %, based on the total amount (total weight, 100 wt %) of the photosensitive resin composition. When the surfactant is used in an amount outside of the above range, impurities may be generated after development.

The photosensitive resin composition according to one embodiment may be an alkali development type capable of being cured by radiating light and being developed with an alkali aqueous solution. When the photosensitive resin composition is laminated on (applied to) a substrate and radiated by an actinic ray to form a pattern for a color filter, the exposed portion of the photosensitive resin composition is reacted by the actinic ray and thus exhibits sharply deteriorated solubility as compared to a non-reacted (non-exposed) region portion of the photosensitive resin composition. Accordingly, the non-reacted region may be selectively dissolved. The solution removing a non-exposed region is called a developing solution. The developing solution can be classified into two types, an organic solvent type and an alkali development type. The organic solvent type developing solution causes atmosphere contamination and can harm a human body, and thus the alkali development type solution may be used. The photosensitive resin composition according to one embodiment uses an alkali development type solution.

Another embodiment provides a color filter manufactured using the above photosensitive resin composition.

An exemplary embodiment of a method of manufacturing the color filter is as follows.

The above photosensitive resin composition can be coated to form an about 0.5 µm to about 10 µm-thick resin composition layer on a glass substrate using an appropriate method such as spin coating, roller coating, spray coating, and the like.

Subsequently, the substrate having the resin composition layer can be radiated by light (exposed to radiation) to form a pattern required for a color filter. The radiation may be performed by using UV, an electron beam, or an X-ray as a light source, for example, UV in a range of about 190 nm to about 450 nm, for example UV in a range of about 200 nm to about 400 nm. The radiation may be performed by further using a photoresist mask. After performing the radiation process in this way, the resin composition layer exposed to the light source can be treated with a developing solution. Herein, a non-exposed region in the resin composition layer can be dissolved to form the pattern required for a color filter. This process can be repeated according to the number of necessary colors, obtaining a color filter having a desired pattern. In addition, crack resistance, solvent resistance, and the like may be improved by reheating the image pattern obtained through the development, radiating an actinic ray thereinto (further exposing to radiation), or the like to cure it.

Hereinafter, the present invention is illustrated in more detail with reference to the following examples. These examples, however, are not to be interpreted as limiting the scope of the invention.

Preparation of Dye

Preparation Example 1

(1) 5 g of 3,4,5,6-tetrachlorophthalonitrile, 3.201 g of 2-phenylphenol, 3.898 g of $K_2CO_3$ and 50 ml of acetonitrile are put in a 100 ml flask and then heated and refluxed. When the reaction is complete, the resultant is filtered and washed with tetrahydrofuran (THF), a solid obtained therefrom is dissolved in dichloromethane, and hexane is added thereto, obtaining a crystallized solid (4-(biphenyl-2-yloxy)-3,5,6-trichlorophthalonitrile). This obtained solid is several times cleaned, filtered and vacuum-dried.

(2) The solid (4-(biphenyl-2-yloxy)-3,5,6-trichlorophthalonitrile) (1.0 g), 3,4,5,6-tetrachlorophthalonitrile (2.0 g), 1,8-diazabicycloundec-7-ene (3.0 g) and 1-pentenol (30 mL) are put in a 100 mL flask and then heated and dissolved. Then, zinc acetate (0.46 g) is added thereto, and the mixture is heated and refluxed. When the reaction is complete, a remainder obtained by removing a solvent therefrom is purified through column chromatography. Then, dichloromethane in an appropriate amount is added to the obtained solid to dissolve the solid, and hexane is added thereto to perform crystallization. The obtained solid is filtered and vacuum-dried, obtaining a compound represented by the following Chemical Formula 7.

[Chemical Formula 7]

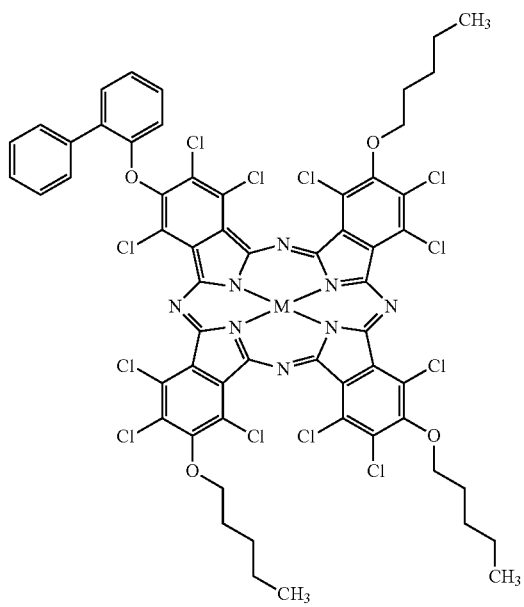

Maldi-tof MS 1417.93 m/z

Preparation Example 2

The solid (4-(biphenyl-2-yloxy)-3,5,6-trichlorophthalonitrile) (1.0 g), 3,4,5,6-tetrachlorophthalonitrile (0.67 g), 1,8- diazabicycloundec-7-ene (1.5 g) and 1-pentenol (15 mL) are put in a 100 mL flask and then heated and refluxed. Then, zinc acetate (0.23 g) is added thereto, and the mixture is heated and refluxed. When the reaction is complete, a remainder obtained after removing a solvent therefrom is purified through column chromatography. Then, dichloromethane in an appropriate amount is added to the obtained solid to dissolve it, and hexane is added thereto to perform crystallization. The obtained solid is filtered and vacuum-dried, obtaining a compound represented by the following Chemical Formula 8.

[Chemical Formula 8]

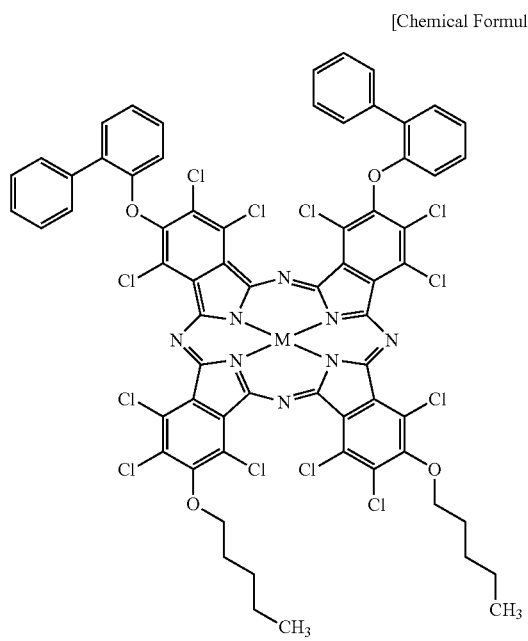

Maldi-tof MS 1499.93 m/z

Preparation Example 3

The solid (4-(biphenyl-2-yloxy)-3,5,6-trichlorophthalonitrile) (1.0 g), 3,4,5,6-tetrachlorophthalonitrile (0.22 g), and 1,8-diazabicycloundec-7-ene (1.0 g) are added to 1-pentenol (10 mL) in a 100 mL flask and then heated and dissolved therein. Then, zinc acetate (0.15 g) is added thereto, and the mixture is heated and refluxed. When the reaction is complete, a remainder obtained after removing a solvent therefrom is purified through column chromatography. Then, dichloromethane in an appropriate amount is added to the obtained solid to dissolve it, and hexane is added thereto to perform crystallization. The obtained solid is filtered and vacuum-dried, obtaining a compound represented by the following Chemical Formula 9.

[Chemical Formula 9]

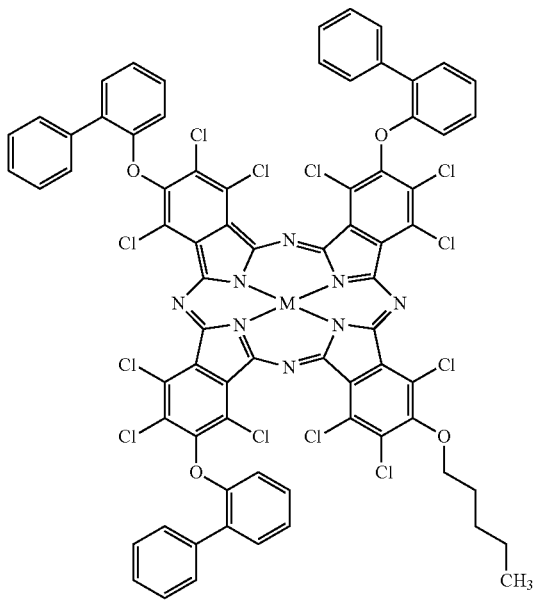

Maldi-tof MS 1581.90 m/z

Preparation of Photosensitive Resin Composition

Examples 1 to 7 and Comparative Examples 1 and 2

The following photopolymerization initiator is dissolved in the following solvent according to a composition provided in the following Table 1, and the solution is agitated at room temperature for 2 hours. Subsequently, an acrylic-based binder resin and a photopolymerizable monomer are added thereto, and the mixture is agitated at room temperature for 2 hours. Then, a pigment and the dye prepared in Preparation Example 1 are added thereto, the mixture is agitated at room temperature for one hour, a surfactant is added thereto, and the resulting mixture is agitated at room temperature for one hour. The solution is three times filtered to remove impurities therein, preparing each photosensitive resin composition according to Examples 1 to 7 and Comparative Examples 1 and 2. The photosensitive resin composition is prepared by using the following components.

(A) Binder Resin
(A-1) epoxy binder resin (epoxy equivalent: 177 g/eq) (EHPE-3150, DAICEL CHEMICAL)
(A-2) acrylic-based binder resin (SKY-095, Samsung SDI Inc.)
(A-3) acrylic-based binder resin (SKY-141, Samsung SDI Inc.)
(B) Photopolymerizable Monomer
(B-1) Photopolymerizable monomer (DPHA)
(B-2) Photopolymerizable monomer developability improvement-type (A-BPE-20, SHIN-NAKAMURA CHEMICAL)
(C) Photopolymerization Initiator
(C-1) oxime-based compound (IRGARCURE OXE01, BASF)
(D) Colorant
(Pigment Dispersion (Pigment Solid 12%))
(D-1) Y138 (SF Yellow GC6018, SANYO COLOR WORKS, Ltd.)
(Dye)
(D-2) Dye of Preparation Example 1
(D-3) Dye of Preparation Example 2
(D-4) Dye of Preparation Example 3
(E) Solvent
(E-1) propylene glycolmonomethyl ether acetate (PGMEA)

(F) Additive
(F-1) Surfactant (F-554, DIC Co., Ltd.)

TABLE 1

(unit: wt %)

|  |  | Ex. 1 | Ex. 2 | Ex. 3 | Ex. 4 | Ex. 5 | Ex. 6 | Ex. 7 | Comp. Ex. 1 | Comp. Ex. 2 |
|---|---|---|---|---|---|---|---|---|---|---|
| (A) Binder resin** | A-1 | 1.100 | 1.500 | 1.900 | 2.145 | 0.796 | 1.100 | 1.100 | — | — |
|  | A-2 | 8.208 | 7.820 | 7.436 | 10.690 | 9.826 | 8.208 | 8.208 | 5.954 | 5.767 |
|  | A-3 | 6.488 | 6.182 | 5.879 | — | 2.390 | 6.488 | 6.488 | 3.083 | 2.986 |
| (B) Photopolymerizable monomer | B-1 | 3.601 | 3.431 | 3.263 | 4.290 | 4.775 | 3.601 | 3.601 | 7.986 | 7.348 |
|  | B-2 | 0.400 | 0.382 | 0.363 | 1.073 | 0.531 | 0.400 | 0.400 | — | 0.387 |
| (C) Photopolymerization initiator | C-1 | 0.400 | 0.382 | 0.363 | 0.536 | 0.690 | 0.400 | 0.400 | 0.456 | 0.884 |
| (D) Colorant*** | D-1 | 20.087 | 20.888 | 21.679 | 19.631 | 20.207 | 20.087 | 20.087 | 18.999 | 19.689 |
|  | D-2 | 46.858 | 44.975 | 43.065 | 47.978 | 47.689 | — | — | 46.634 | 41.105 |
|  | D-3 | — | — | — | — | — | 46.858 | — | — | — |
|  | D-4 | — | — | — | — | — | — | 46.858 | — | — |
| (E) Solvent | E-1 | 12.658 | 14.240 | 15.852 | 13.457 | 12.896 | 12.658 | 12.658 | 16.688 | 21.634 |
| (F) Additive | F-1 | 0.200 | 0.200 | 0.200 | 0.200 | 0.200 | 0.200 | 0.200 | 0.200 | 0.200 |
| Total |  | 100.00 | 100.00 | 100.00 | 100.00 | 100.00 | 100.00 | 100.00 | 100.00 | 100.00 |

(**an acrylic-based binder resin based on 30% of a solid)
(***as for a colorant, the amount of the colorant indicates the sum of the amount of a pigment-dispersion and a dye when the dye is a 5% PGMEA solution).

Evaluation: Color Characteristics and Heat Resistance of Photosensitive Resin Composition Each photosensitive resin composition according to Examples 1 to 7 and Comparative Examples 1 and 2 is respectively coated on a glass substrate with a coating equipment (MIKASA Co., Ltd.) and dried on a hot plate at 90° C., obtaining each film. The films are exposed to light with 50 mJ/cm$^2$ of an exposure dose and baked at an oven condition of 230° C. for 28 minutes. The films are additionally baked at 230° C. for 1 hour, a color coordinate and luminance of the films are measured by using a spectrophotometer (Otsuka Electronics Co., Ltd., MCPD 3000) before and after post-baking (PSB), a difference before and after the additional baking is calculated to examine heat resistance properties, and the results are provided in the following Tables 2 and 3. Color coordinate (Gx) and luminance (Y) are calculated based on the color coordinate (Gy).

TABLE 2

|  | Step | Color coordinate (Gx) | Color coordinate (Gy) | Luminance (Y) | Contrast ratio |
|---|---|---|---|---|---|
| Ex. 1 | Before additional baking | 0.2746 | 0.5675 | 61.57 |  |
|  | After additional baking | 0.2764 | 0.5675 | 60.53 | 17717 |
| Ex. 2 | Before additional baking | 0.2781 | 0.5675 | 62.39 |  |
|  | After additional baking | 0.2793 | 0.5675 | 61.20 | 17890 |
| Ex. 3 | Before additional baking | 0.2817 | 0.5675 | 63.57 |  |
|  | After additional baking | 0.2822 | 0.5675 | 61.92 | 18094 |
| Ex. 4 | Before additional baking | 0.2744 | 0.5675 | 63.55 |  |
|  | After additional baking | 0.2759 | 0.5675 | 62.65 | 16420 |
| Ex. 5 | Before additional baking | 0.2765 | 0.5675 | 61.44 |  |
|  | After additional baking | 0.2756 | 0.5675 | 61.32 | 17324 |
| Ex. 6 | Before additional baking | 0.2751 | 0.5675 | 63.57 |  |
|  | After additional baking | 0.2767 | 0.5675 | 62.31 | 17659 |
| Ex. 7 | Before additional baking | 0.2754 | 0.5675 | 63.59 |  |
|  | After additional baking | 0.2771 | 0.5675 | 62.15 | 18016 |
| Comp. Ex. 1 | Before additional baking | 0.2740 | 0.5675 | 60.46 |  |
|  | After additional baking | 0.2755 | 0.5675 | 60.12 | 6319 |
| Comp. Ex. 2 | Before additional baking | 0.2728 | 0.5675 | 60.20 |  |
|  | After additional baking | 0.2779 | 0.5675 | 59.92 | 10725 |

TABLE 3

|  | ΔGx | ΔY | ΔEab* | ΔT |
|---|---|---|---|---|
| Example 1 | 0.0018 | −1.04 | 1.07 | 0.06 |
| Example 2 | 0.0012 | −1.19 | 0.66 | 0.05 |
| Example 3 | 0.0005 | −1.65 | 0.70 | 0.04 |
| Example 4 | 0.0015 | −0.90 | 0.93 | 0.06 |
| Example 5 | −0.0009 | −0.12 | 0.44 | 0.04 |
| Example 6 | 0.0016 | −1.26 | 1.11 | 0.05 |
| Example 7 | 0.0017 | −1.44 | 1.18 | 0.06 |
| Comparative Example 1 | 0.0015 | −0.34 | 1.35 | 0.15 |
| Comparative Example 2 | 0.0051 | −0.28 | 2.47 | 0.19 |

In Table 3, ΔEab* indicates a color variation ratio, and ΔT is a thickness difference before dipping a substrate before additional baking in a 80° C. solution including NMP (N-methyl-2-pyrrolidone), GBL (gamma-butyrolactone) and 2-BC (2-butylcellosolve) for 5 minutes and after additionally baking it at 230° C. for 28 minutes.

Referring to Tables 2 and 3, the photosensitive resin compositions using a dye and a binder resin including an epoxy resin according to Examples 1 to 7 of the present invention exhibit excellent luminance and contrast ratio and a low color variation ratio and thus excellent heat resistance compared with Comparative Examples 1 and 2. In addition, based on the ΔT values, the photosensitive resin compositions according to Examples 1 to 7 exhibit excellent chemical resistance compared with the photosensitive resin compositions according to Comparative Examples 1 and 2. A ΔT value of a photosensitive resin applicable to a color filter is in a range of 0.04 to 0.06.

In addition, referring to FIG. 1 showing a pattern according to Comparative Example 1, a dye is protruded and covered on the surface of the pattern, and the protrusion changed a color coordinate and deteriorated luminance and a contrast ratio.

Figure 2:
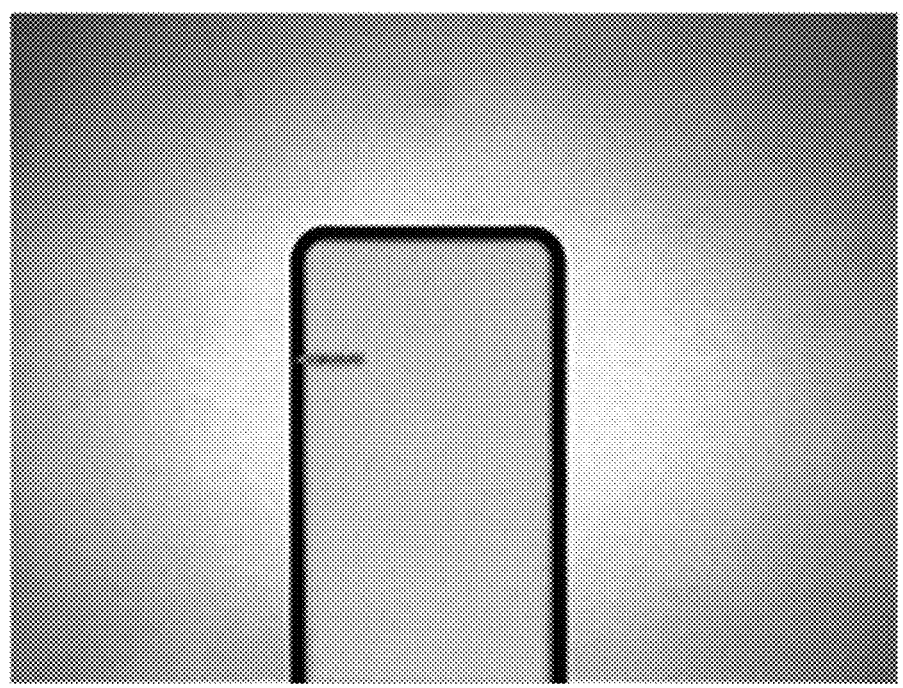
FIG. 2 is a photograph showing a pattern according to Example 1.

In contrast, referring to FIG. 2 showing a pattern according to Example 1, a dye is well fixed inside the pattern due to a binder resin including an epoxy resin and exhibits improved luminance and a contrast ratio without causing a problem on the surface.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

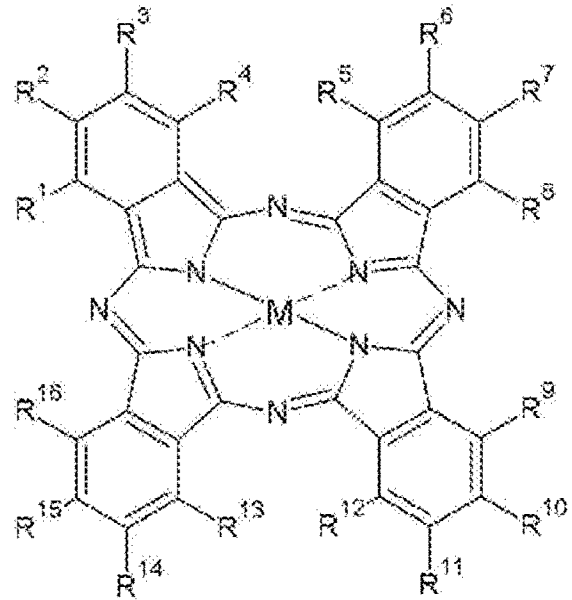

What is claimed is:

1. A photosensitive resin composition, comprising:
(A) a binder resin including an epoxy resin;
(B) a photopolymerizable monomer;
(C) a photopolymerization initiator;
(D) a colorant including a dye represented by the following Chemical Formula 1; and
(E) a solvent:

[Chemical Formula 1]

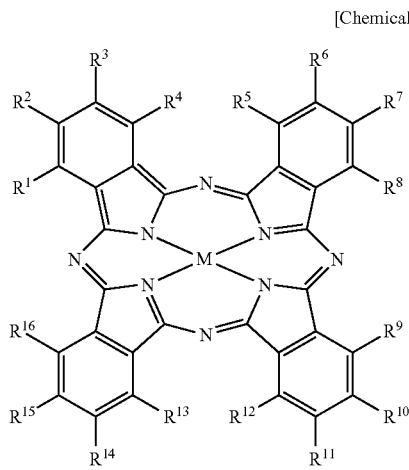

wherein, in the Chemical Formula 1,
M is Cu, Zn, Co, or Mo,
$R^1$ to $R^{16}$ are the same or different and are each independently hydrogen, halogen, substituted or unsubstituted $C_1$ to $C_{20}$ $C_1$ to $C_{20}$ alkyl, substituted or unsubstituted $C_1$ to $C_{20}$ $C_1$ to $C_{20}$ alkoxy, substituted or unsubstituted $C_6$ to $C_{20}$ $C_6$ to $C_{20}$ aryl, or substituted or unsubstituted $C_6$ to $C_{20}$ $C_6$ to $C_{20}$ aryloxy,
wherein at least one of $R^1$ to $R^{16}$ is substituted or unsubstituted $C_1$ to $C_{20}$ alkoxy, and at least one of $R^1$ to $R^{16}$ is substituted or unsubstituted $C_6$ to $C_{20}$ aryloxy represented by the following Chemical Formula 2:

[Chemical Formula 2]

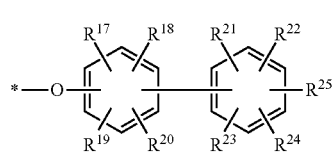

wherein, in the Chemical Formula 2,
$R^{17}$ to $R^{25}$ are the same or different and are each independently hydrogen, halogen, or substituted or unsubstituted $C_1$ to $C_8$ alkyl.

2. The photosensitive resin composition of claim 1, wherein the $C_1$ to $C_{20}$ alkoxy is methoxy, ethoxy, propoxy, butoxy, pentyloxy, hexyloxy, heptyloxy, octyloxy, nonyloxy, or decyloxy.

3. The photosensitive resin composition of claim 1, wherein at least one of $R^1$ to $R^4$ is substituted or unsubstituted $C_6$ to $C_{20}$ aryloxy,
at least one of $R^5$ to $R^8$ is substituted or unsubstituted $C_6$ to $C_{20}$ aryloxy,
at least one of $R^9$ to $R^{12}$ is substituted or unsubstituted $C_6$ to $C_{20}$ aryloxy, and
at least one of $R^{13}$ to $R^{16}$ is substituted or unsubstituted $C_1$ to $C_{20}$ alkoxy.

4. The photosensitive resin composition of claim 1, wherein at least one of $R^1$ to $R^4$ is substituted or unsubstituted $C_6$ to $C_{20}$ aryloxy,
at least one of $R^5$ to $R^8$ is substituted or unsubstituted $C_1$ to $C_{20}$ alkoxy,
at least one of $R^9$ to $R^{12}$ is substituted or unsubstituted $C_1$ to $C_{20}$ alkoxy, and
at least one of $R^{13}$ to $R^{16}$ is substituted or unsubstituted $C_1$ to $C_{20}$ alkoxy.

5. The photosensitive resin composition of claim 1, wherein at least one of $R^1$ to $R^4$ is substituted or unsubstituted $C_6$ to $C_{20}$ aryloxy,
at least one of $R^5$ to $R^8$ is substituted or unsubstituted $C_1$ to $C_{20}$ alkoxy,
at least one of $R^9$ to $R^{12}$ is substituted or unsubstituted $C_6$ to $C_{20}$ aryloxy, and
at least one of $R^{13}$ to $R^{16}$ is substituted or unsubstituted $C_1$ to $C_{20}$ alkoxy.

6. The photosensitive resin composition of claim 1, wherein at least one of $R^1$ to $R^4$ is substituted or unsubstituted $C_6$ to $C_{20}$ aryloxy,
at least one of $R^5$ to $R^8$ is substituted or unsubstituted $C_6$ to $C_{20}$ aryloxy,
at least one of $R^9$ to $R^{12}$ is substituted or unsubstituted $C_1$ to $C_{20}$ alkoxy, and
at least one of $R^{13}$ to $R^{16}$ is substituted or unsubstituted $C_1$ to $C_{20}$ alkoxy.

7. The photosensitive resin composition of claim 1, wherein the dye represented by Chemical Formula 1 is represented by one of the following Chemical Formulae 3 to 6:

[Chemical Formula 3]
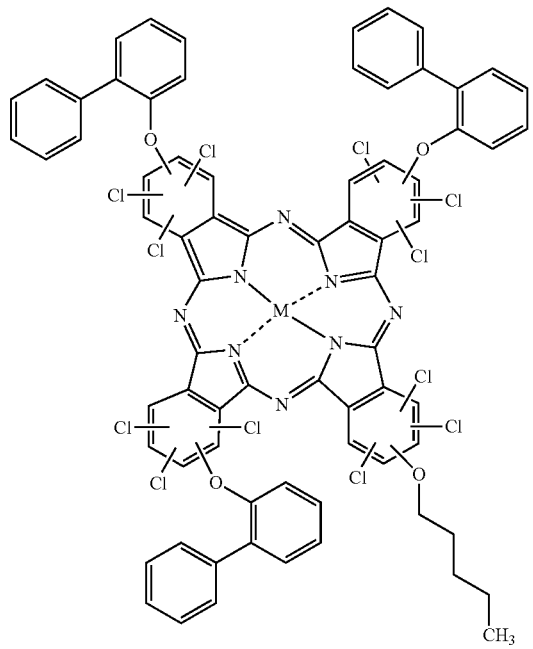
[Chemical Formula 4]
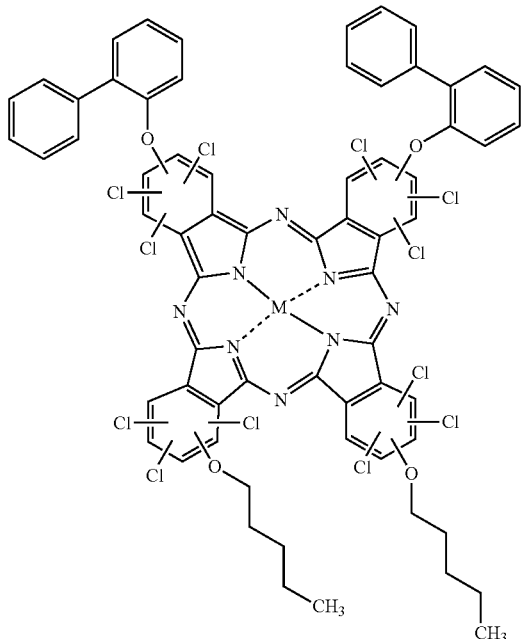
[Chemical Formula 5]
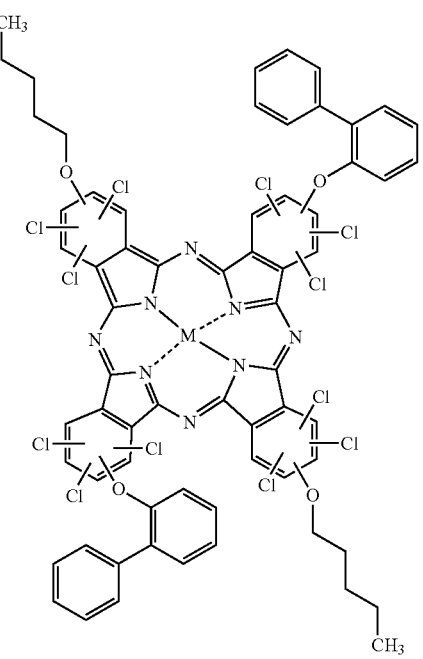
[Chemical Formula 6]
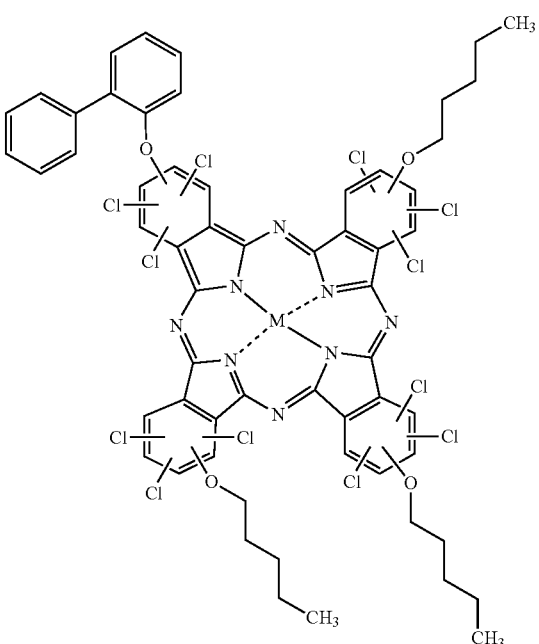
wherein, in Chemical Formulae 3 to 6,
M is Cu, Zn, Co or Mo.
8. The photosensitive resin composition of claim 1, wherein the dye represented by Chemical Formula 1 is a mixture of at least two of compounds represented by the following Chemical Formulae 3 to 6:

[Chemical Formula 3]

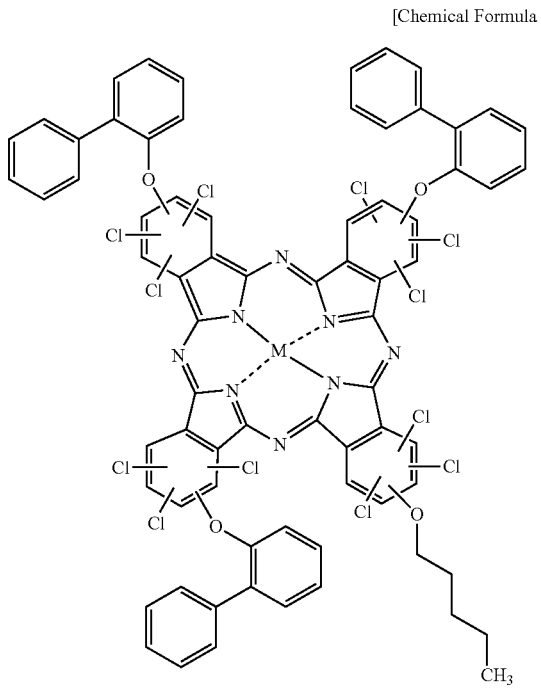

[Chemical Formula 4]

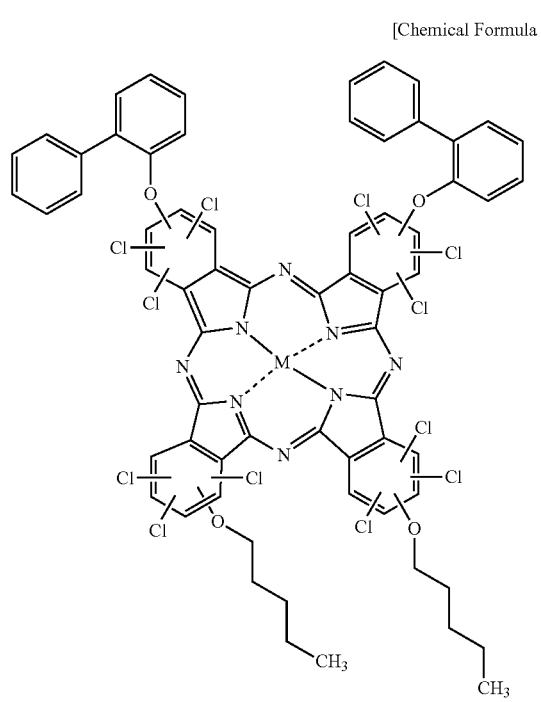

[Chemical Formula 5]

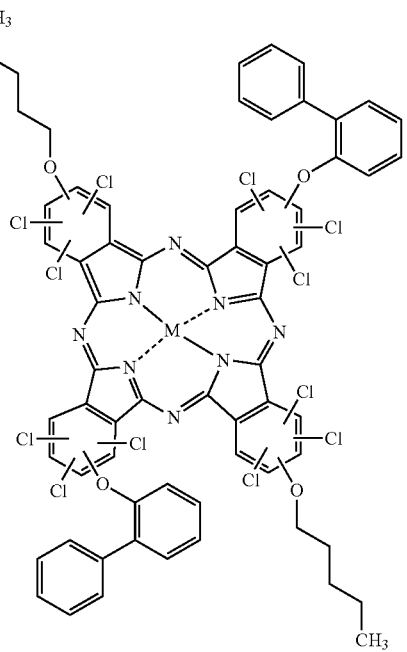

[Chemical Formula 6]

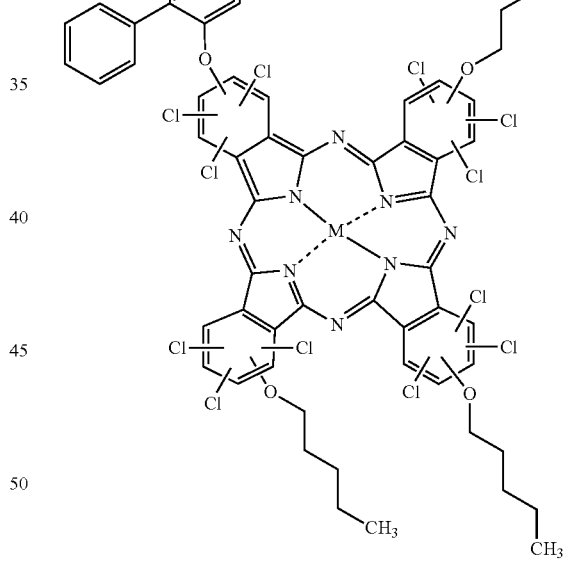

wherein, in Chemical Formulae 3 to 6,
M is Cu, Zn, Co or Mo.

9. The photosensitive resin composition of claim 1, comprising the dye represented by Chemical Formula 1 in an amount of about 2 wt % to about 3 wt % based on the total weight of the photosensitive resin composition.

10. The photosensitive resin composition of claim 1, wherein the dye represented by Chemical Formula 1 is a green dye.

11. The photosensitive resin composition of claim 1, wherein the colorant further comprises a pigment.

12. The photosensitive resin composition of claim 11, comprising the dye and the pigment in a weight ratio of about 3:7 to about 7:3.

13. The photosensitive resin composition of claim 1, wherein the binder resin further comprises an acrylic-based binder resin.

14. The photosensitive resin composition of claim 1, wherein the photosensitive resin composition comprises:
    (A) about 1 wt % to about 30 wt % of the binder resin;
    (B) about 1 wt % to about 20 wt % of the photopolymerizable monomer;
    (C) about 0.1 wt % to about 10 wt % of the photopolymerization initiator;
    (D) about 40 wt % to about 70 wt % of the colorant; and
    (E) a balance amount of the solvent.

15. The photosensitive resin composition of claim 1, wherein the photosensitive resin composition further comprises malonic acid; 3-amino-1,2-propanediol; a silane-based coupling agent having a vinyl group or a (meth)acryloxy group; a leveling agent; a fluorine-based surfactant; a radical polymerization initiator, or a combination thereof.

16. A color filter using the photosensitive resin composition of claim 1.

\* \* \* \* \*

UNITED STATES PATENT AND TRADEMARK OFFICE
CERTIFICATE OF CORRECTION

PATENT NO. : 10,007,028 B2
APPLICATION NO. : 14/593243
DATED : June 26, 2018
INVENTOR(S) : Se-Young Choi It is certified that error appears in the above-identified patent and that said Letters Patent is hereby corrected as shown below:

On the Title Page

<u>In the Abstract</u>
Delete Chemical Formula 1 and insert:

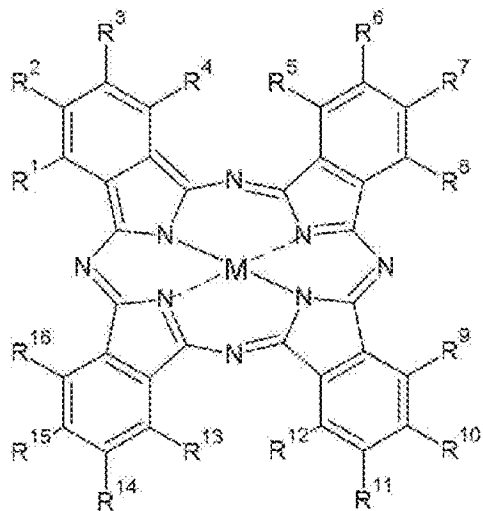

Signed and Sealed this
Sixth Day of November, 2018

Andrei Iancu
*Director of the United States Patent and Trademark Office*

CERTIFICATE OF CORRECTION (continued)
U.S. Pat. No. 10,007,028 B2

In the Specification

Column 2 delete Chemical Formula 1 and insert:

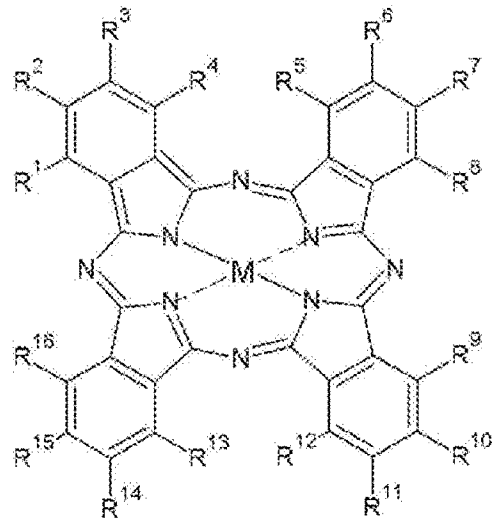

Column 3 delete Chemical Formula 3 and insert:

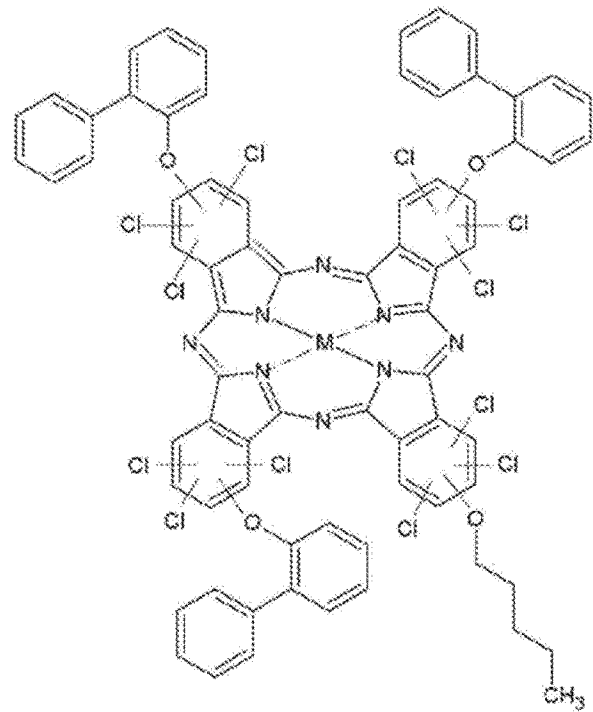

CERTIFICATE OF CORRECTION (continued)
U.S. Pat. No. 10,007,028 B2

Column 6 delete Chemical Formula 1 and insert:

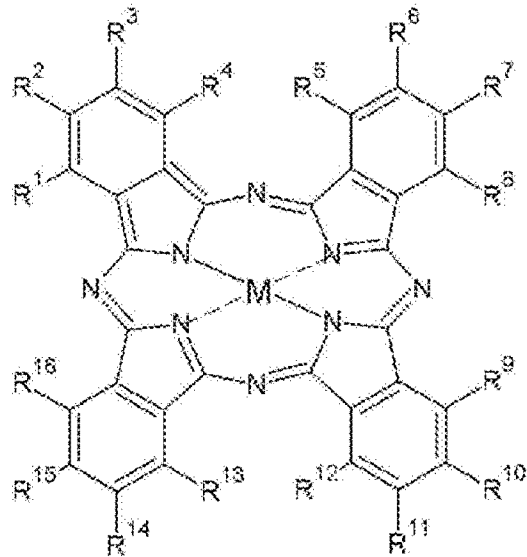

Column 18 delete Chemical Formula 7 and insert:

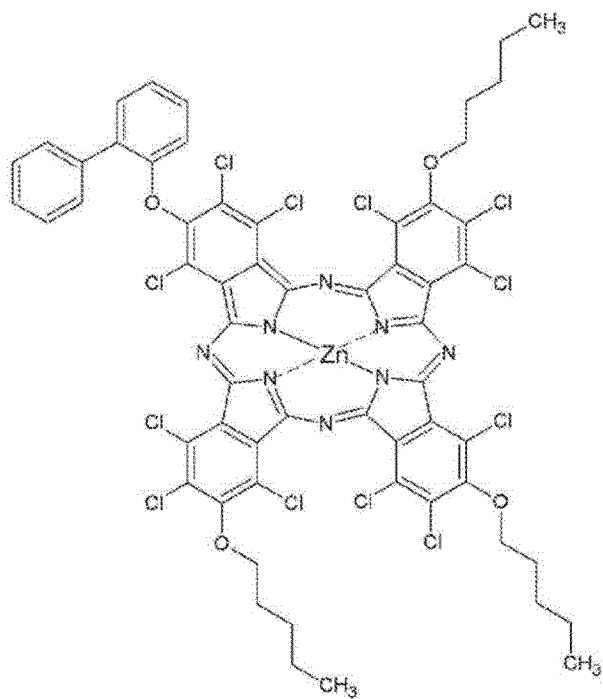

Column 19 delete Chemical Formula 8 and insert:
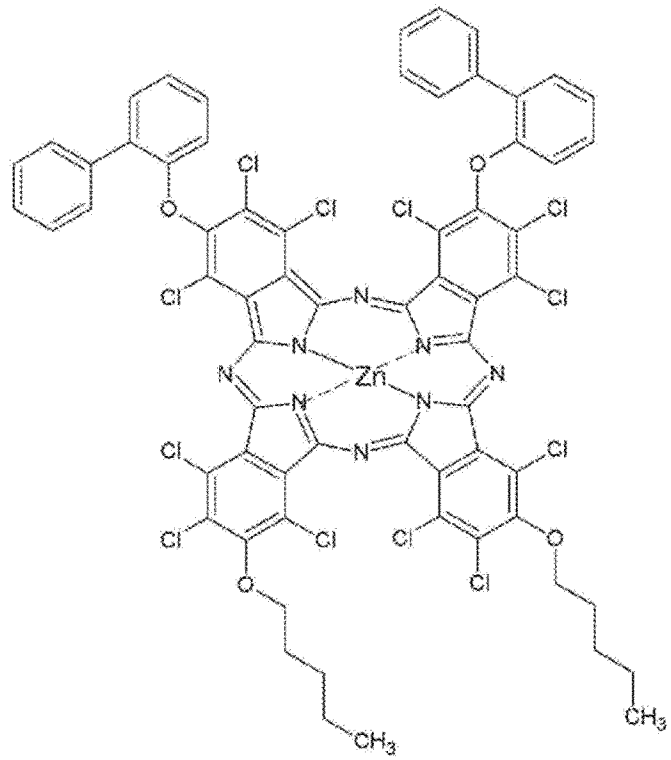
Column 20 delete Chemical Formula 9 and insert:
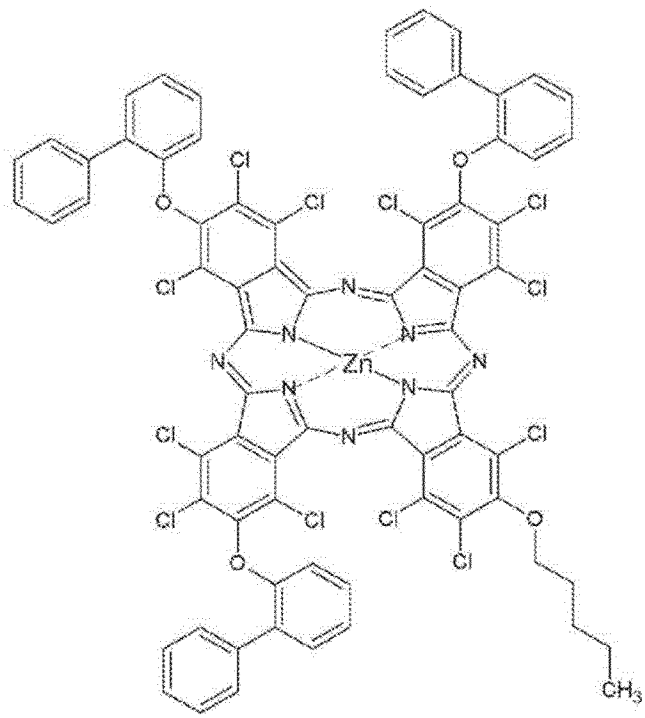

CERTIFICATE OF CORRECTION (continued)
U.S. Pat. No. 10,007,028 B2

In the Claims

Column 23, Claim 1 delete Chemical Formula 1 and insert: